United States Patent
Ichikawa et al.

[11] Patent Number: 6,165,818
[45] Date of Patent: Dec. 26, 2000

[54] METHOD OF MANUFACTURING A SEMICONDUCTOR DEVICE WITH A PAIR OF RADIATING TERMINALS AND A PLURALITY OF LEAD TERMINALS FORMED FROM A SINGLE LEAD FRAME

[75] Inventors: Seiji Ichikawa; Takeshi Umemoto; Toshiaki Nishibe; Kazunari Sato; Kunihiko Tsubota; Masato Suga; Yoshikazu Nishimura; Keita Okahira; Tatsuya Miya; Toru Kitakoga; Kazuhiro Tahara, all of Tokyo, Japan

[73] Assignee: NEC Corporation, Tokyo, Japan

[21] Appl. No.: 09/074,120

[22] Filed: May 7, 1998

[30] Foreign Application Priority Data

May 21, 1997 [JP] Japan ................... 9-130986

[51] Int. Cl.⁷ .......................... H01L 21/44; H01L 21/495
[52] U.S. Cl. ...................... 438/123; 438/106; 438/111; 438/124; 438/127; 257/666; 257/672; 257/675; 257/678; 257/690; 257/692; 257/734; 257/735; 257/787; 257/788; 257/789
[58] Field of Search .................... 438/106, 123, 438/597, 611, 617, 111, 124, 127; 257/666, 672, 675, 678, 690, 691, 692, 734, 735, 736, 787, 788, 789, 790, 791, 795

[56] References Cited

U.S. PATENT DOCUMENTS

| | | | |
|---|---|---|---|
| 3,413,713 | 12/1968 | Helda et al. | 29/588 |
| 3,967,366 | 7/1976 | Birglechner et al. | 438/111 |
| 5,200,806 | 4/1993 | Sawaya | 257/676 |
| 5,612,853 | 3/1997 | Kim et al. | 361/723 |
| 5,877,937 | 3/1999 | Shibata et al. | 361/719 |

FOREIGN PATENT DOCUMENTS

| | | | |
|---|---|---|---|
| 61-125058 | 6/1986 | Japan | H01L 23/48 |
| 62-198144 | 9/1987 | Japan | H01L 23/48 |
| 62-206868 | 9/1987 | Japan | H01L 23/48 |
| 63-207161 | 8/1988 | Japan | H01L 23/50 |
| 1262649 | 10/1989 | Japan | H01L 23/36 |
| 217856 | 2/1990 | Japan | H01L 23/50 |
| 4225268 | 8/1992 | Japan | H01L 23/50 |
| 6120396 | 4/1994 | Japan | H01L 23/50 |
| 9-186270 | 7/1997 | Japan | H01L 23/28 |

Primary Examiner—Wael Fahmy
Assistant Examiner—Brook Kebede
Attorney, Agent, or Firm—Hayes, Soloway, Hennessey, Grossman & Hage, P.C.

[57] ABSTRACT

A semiconductor device is disclosed wherein a pair of radiating terminals and a plurality of lead terminals are formed from a single lead frame. A hole or holes in each radiating terminal are formed with an equal width and in an equal pitch to those of gaps between the lead terminals, and the opposite sides of each hole of the radiating terminal are connected to each other by a support element. The support elements of the radiating terminals and support elements which interconnect the lead terminals are formed with an equal length and in an equal pitch to allow the support elements to be cut away by a plurality of punches which are arranged in an equal pitch and have an equal width.

4 Claims, 4 Drawing Sheets

METHOD OF MANUFACTURING A SEMICONDUCTOR DEVICE WITH A PAIR OF RADIATING TERMINALS AND A PLURALITY OF LEAD TERMINALS FORMED FROM A SINGLE LEAD FRAME

BACKGROUND OF THE INVENTION

1. Field of the Invention

This invention relates to a method of manufacturing a semiconductor device, and more particularly to a method of manufacturing a semiconductor device wherein a pair of radiating terminals and a plurality of lead terminals are formed from a single lead frame.

2. Description of the Related Art

Conventionally, semiconductor devices such as an LSI (Large Scale Integrated Circuit) and a transistor are utilized in various electronic apparatus.

In such apparatus as just mentioned, a pellet comprising a semiconductor circuit is encapsulated in a resin member, and a plurality of lead terminals each formed from an elongated conductive plate are provided on the opposite sides of the resin member. Since those lead terminals are connected to connection pads of the pellet in the inside of the resin member, if the semiconductor device is mounted on a circuit board and the lead terminals are connected to signal lines, then various signals can be inputted to and outputted from the pellet.

While such semiconductor devices are utilized in various applications,for example, a semiconductor device for use with a portable telephone set consumes a large amount of power, and consequently, a pellet of the semiconductor device generates a large amount of heat. Therefore, the generated heat of the pellet must be radiated efficiently.

A conventional example of a semiconductor device which solves the subject just described is described below with reference to FIG. 1.

In integrated circuit device 1 which is a semiconductor device shown as an example here, a pellet of an integrated circuit formed from a semiconductor circuit is mounted on a radiating plate in the form of an island (not shown), and a pair of radiating terminals 2 having a comparatively large width are provided on the opposite left and right sides of the radiating plate.

A plurality of lead terminals 3 having a comparatively small width are arranged at positions forwardly and rearwardly of and adjacent to radiating terminals 2. Lead terminals 3 are connected to connection pads of the pellet by bonding wires (not shown).

Since the pellet, the radiating plate, the bonding wires, inner portions of radiating terminals 2 and inner 25 portions of lead terminals 3 are encapsulated in resin member 4, outer portions 5 and 6 of terminals 2 and 3 are provided projectingly on the left and right side faces of resin member 4.

Outer portions 5 and 6 of terminals 2 and 3 are bent downwardly, and each of radiating terminals 2 has a hole 7 in the form of a slit formed at the bent portion thereof.

When integrated circuit device 1 having such a construction as described above is to be mounted onto an upper surface of a circuit board, the plurality of-lead terminals 3 of integrated circuit device 1 are connected to a plurality of signal lines of the circuit board by solder, and the pair of radiating terminals 2 are connected to conductor patterns such as grounding lines of the circuit board.

Thus, the pellet can input and output various information signals to and from the signal lines of the circuit board, and when the pellet generates heat, the heat is radiated from radiating terminals 2.

A method of manufacturing integrated circuit device 1 having such a construction as described above is described briefly below with reference to FIGS. 2 and 3.

First, leadframe11 is formed by etching a thin metal plate as seen in FIG. 2. On this lead frame 11, a plurality of frame patterns 12 of integrated circuit devices 1 are arranged in rows and columns, and radiating plate 13 is positioned at the center of one frame pattern 12.

A pair of radiating terminals 2 having a comparatively large width are provided on the opposite left and right sides of radiating plate 13. A plurality of lead terminals 3 having a comparatively small width are arranged on the opposite front and rear sides, which are upper and lower sides in FIG. 2, of radiating terminals 2.

Intermediate portions of terminals 2 and 3 are connected to each other by a plurality of tie bars 14. Outer end portions of terminals 2 and 3 are connected to outer frame portion 16 of frame pattern 12 by suspending pins 15.

Inner portions 17 of lead terminals 3 are formed such that they are directed radially toward the center of radiating plate 13. Inner portions 18 of radiating terminals 2 are formed integrally with radiating plate 13.

Holes 7 each in the form of a slit are formed at portions of outer portions 5 of radiating terminals 2 at which radiating terminals 2 are to be bent later.

A pellet comprising a semiconductor circuit is placed onto an upper face of radiating plate 13 of lead frame 11 formed in such a manner as described above, and a plurality of connection pads of the pellet and the plurality of lead terminals 3 are individually connected to each other with bonding wires (not shown).

Lead frame 11 on which the pellet and the bonding wires are mounted integrally in this manner is placed into a cavity of a set of mutually removable metal molds such that it is held at outer portions 5 and 6 of radiating terminals 2 and 3 thereof by and between the metal molds, and in this state, molten resin is filled into the cavity of the metal molds and is then left so as to be solidified to form resin member 4.

Then, as shown in FIG. 3, tie bars 14 and suspending pins 15 of lead frame 11 which are exposed to the outside from resin member 4 are cut away by punches 19 to 21 so that outer portions 5 and 6 of radiating terminals 2 and lead terminals 3 are separated from each other, and outer portions 5 and 6 are bent downwardly, thereby completing integrated circuit device 1.

When outer portions 5 and 6 of terminals 2 and 3 are bent in this manner, although radiating terminals 2 generally have a comparatively large width, since holes 7 are formed at the bent portions of radiating terminals 2, radiating terminals 2 can be bent readily similarly to lead terminals 3 having a comparatively small width.

However, since radiating terminals 2 and lead terminals 3 have different widths, punches 19 to 20 for cutting away tie bars 14 and suspending pins 15 cannot be arranged in an equal pitch.

Where punches 19 and 20 cannot be arranged in an equal pitch, operations for setting punches 19 and 20 to a press machine (not shown) are cumbersome, and also the universality of thus set punches 19 and 20 is low.

Further, in order to cut away suspending pins 15 of lead terminals 3 having a comparatively small width and suspending pins 15 of radiating terminals 2 having a comparatively large width, punches 20 having a comparatively small width and punches 21 having a comparatively large width are required. In other wards, since a plurality of kinds of punches 20 and 21 having different widths are required, the productivity of integrated circuit device 1 is deteriorated thereby.

SUMMARY OF THE INVENTION

It is an object of the present invention to provide a method of manufacturing a semiconductor device which is high in productivity and a lead frame which contributes to improvement in productivity of a semiconductor device.

In a conventional method of manufacturing a semiconductor device to which the present invention is applied, a lead frame is formed first.

In the lead frame, a single radiating plate and a plurality of lead terminals of a comparatively small width are connected integrally to each other by tie bars and suspending pins. The single radiating plate has a pair of radiating terminals of a comparatively large width formed projectingly on the opposite sides thereof, and the plurality of lead terminals of a comparatively small width are arranged at positions adjacent to the radiating terminals.

A pellet comprising a semiconductor circuit having a plurality of connection pads provided on an upper surface thereof is placed onto an upper surface of the radiating plate of the lead frame formed in such a configuration as described above. The plurality of connection pads of the pellet and the plurality of lead terminals of the lead frame are connected individually to each other with bonding wires.

The lead frame on which the pellet and the bonding wires are mounted integrally is placed into a cavity of a set of mutually removable metal molds, and the metal molds are closed integrally such that outer portions of the radiating terminals and the lead terminals are held by the metal molds.

Molten resin is filled into the cavity of the metal molds. The filled resin is left so as to be solidified to form a resin member in which the pellet, the radiating plate, the bonding wires, inner portions of the radiating terminals and inner portions of the lead terminals are encapsulated.

The tie bars and the suspending pins of the lead frame exposed to the outside from the resin member are cut away to separate the outer portions of the radiating terminals and the lead terminals individually from each other. The outer portions of the lead terminals and the lead terminals extending outwardly from the resin member are bent downwardly.

According to the present invention in such a method of manufacturing a semiconductor device as described above, when the lead frame is formed, the radiating terminals and the plurality of lead terminals are, connected to each other at portions thereof to be bent later at the tie bars and at least one hole which has an equal inner width and an equal arrangement pitch as those of gaps between the plurality of lead terminals and whose opposite sides are connected to each other by one of the tie bars is formed at the portion of each of the radiating terminals that is to be bent.

When the tie bars of the lead frame exposed to the outside from the resin member are cut away, the plurality of tie bars positioned at the gaps between the lead terminals and the holes of the radiating terminals are cut away with an equal width and at an equal pitch.

Then, when the outer portions of the radiating terminals and the plurality of lead terminals are bent, the radiating terminals are bent at the positions of the holes.

Accordingly, with the method of manufacturing a semiconductor device of the present invention, the holes are formed in the radiating terminals having a comparatively large width of lead frame at the portion to be bent, and the opposite sides of each of the holes are connected to each other by one of the tie bars. Since the radiating terminals and the plurality of lead terminals are connected to each other by the tie bars and the plurality of tie bars having an equal inner width and an equal arrangement pitch to those of the tie bars, the tie bars are cut away by a plurality of punches arranged in an equal pitch and having an equal width.

Since the plurality of punches for cutting away the plurality of tie bars can be formed with an equal width and can be arranged at an equal pitch, operations for setting the punches in position into a press machine are simple, and also the universality of the punches thus set is good.

It is to be noted that, in the present invention, the direction in which the pellet is mounted with respect to the radiating plate is referred to as upward direction while a direction perpendicular to the direction is referred to as sideward direction. However, such directions are used conveniently in order to simplify description and do not restrict any direction when the device is manufactured or used actually.

Further, the radiating plate in the present invention signifies a member on which a pellet is mounted and which contributes to radiation of heat from the pellet, and allows an island made of a metal.

In the method of manufacturing a semiconductor device of the present invention, when the lead frame is formed, outer end portions of the radiating terminals and the plurality of lead terminals may be connected to an outer frame portion of the lead frame by a plurality of suspending pins having an equal inner width and an equal arrangement pitch, and, when the tie bars and the suspending pins of the lead frame exposed to the outside from the resin member are cut away, the plurality of suspending pins which interconnect the outer end portions of the radiating terminals and the plurality of lead terminals and the outer frame portion may be cut away with equal width and in equal pitch.

In this instance, since radiating terminals having a comparatively large width and the lead terminals of a comparatively small width of lead frame are connected to the outer frame portion of the lead frame by a plurality of suspending pins having an equal inner width and an equal arrangement pitch, the suspending pins are cut away by a plurality of punches arranged in an equal pitch and having an equal width.

Since the plurality of punches for cutting away the plurality of suspending pins can be formed with an equal width and can be arranged in an equal pitch, operations for setting the punches in position into a press machine are simple and also the universality of the punches thus set is good.

A conventional lead frame to which the present invention is applied includes a substantially rectangular radiating plate, a pair of radiating terminals of a comparatively large width provided projectingly on the opposite sides of the radiating plate, a plurality of lead terminals of a comparatively small width arranged at positions adjacent to the radiating terminals, an outer frame portion positioned on the outer side of outer end portions of the radiating terminals and the plurality of lead terminals, a plurality of suspending pins for connecting the outer end portions of the radiating terminals and the plurality of lead terminals individually to the outer frame portion, and a plurality of tie bars for interconnecting intermediate portions of the radiating terminals and the plurality of lead terminals.

In the present invention in such a lead frame as described above, each of the radiating terminals has at least one hole formed therein such that the hole has an equal width and an equal arrangement pitch as those of gaps between the plurality of lead terminals and the opposite sides of the hole are connected to each other by one of the tie bars, and the plurality of tie bars which interconnect the intermediate portions of the radiating terminals and the plurality of lead terminals have an equal overall length and an equal arrangement pitch to those of the tie bars of the holes of the radiating terminals.

Accordingly, with the lead frame of the present invention, the holes are formed in the radiating terminals having a comparatively large width at the portions to be bent of, and the opposite sides of each of the holes are connected to each other by one of the tie bars. Since the radiating terminals and the plurality of lead terminals are connected to each other by the tie bars and the plurality of tie bars having an equal inner width and an equal arrangement pitch to those of the tie bars, the tie bars are cut away by a plurality of punches arranged in an equal pitch and having an equal width.

Since the plurality of punches for cutting away the plurality of tie bars can be formed with an equal width and can be arranged at an equal pitch, operations for setting the punches in position into a press machine are simple, and also the universality of the punches thus set is good.

The lead frame of the present invention may be constructed such that the outer end portions of the radiating terminals and the plurality of lead terminals are connected to the outer frame portion of the lead frame by a plurality of suspending pins which have an equal inner width and an equal arrangement pitch.

In this instance, since radiating terminals having a comparatively large width and the lead terminals of a comparatively small width of lead frame are connected to the outer frame portion of the lead frame by a plurality of suspending pins having an equal inner width and an equal arrangement pitch, the suspending pins are cut away by a plurality of punches arranged in an equal pitch and having an equal width.

Since the plurality of punches for cutting away the plurality of suspending pins can be formed with an equal width and can be arranged in an equal pitch, operations for setting the punches in position into a press machine are simple and also the universality of the punches thus set is good.

The above and other objects, features and advantages of the present invention will become apparent from the following description with reference to the accompanying drawings which illustrate examples of the present invention.

DETAILED DESCRIPTION OF THE PREFERRED EMBODIMENTS

An embodiment of the present invention is described with reference to FIGS. 4 to 7. It is to be noted that those elements of the present embodiment which are common to those of the conventional example described hereinabove are denoted by same terms and detailed description of them is omitted here.

Figure 7:
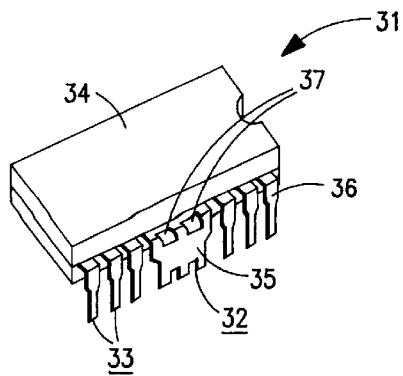
FIG. 7 is a perspective view showing an appearance of a completed semiconductor device.
Figure 8:
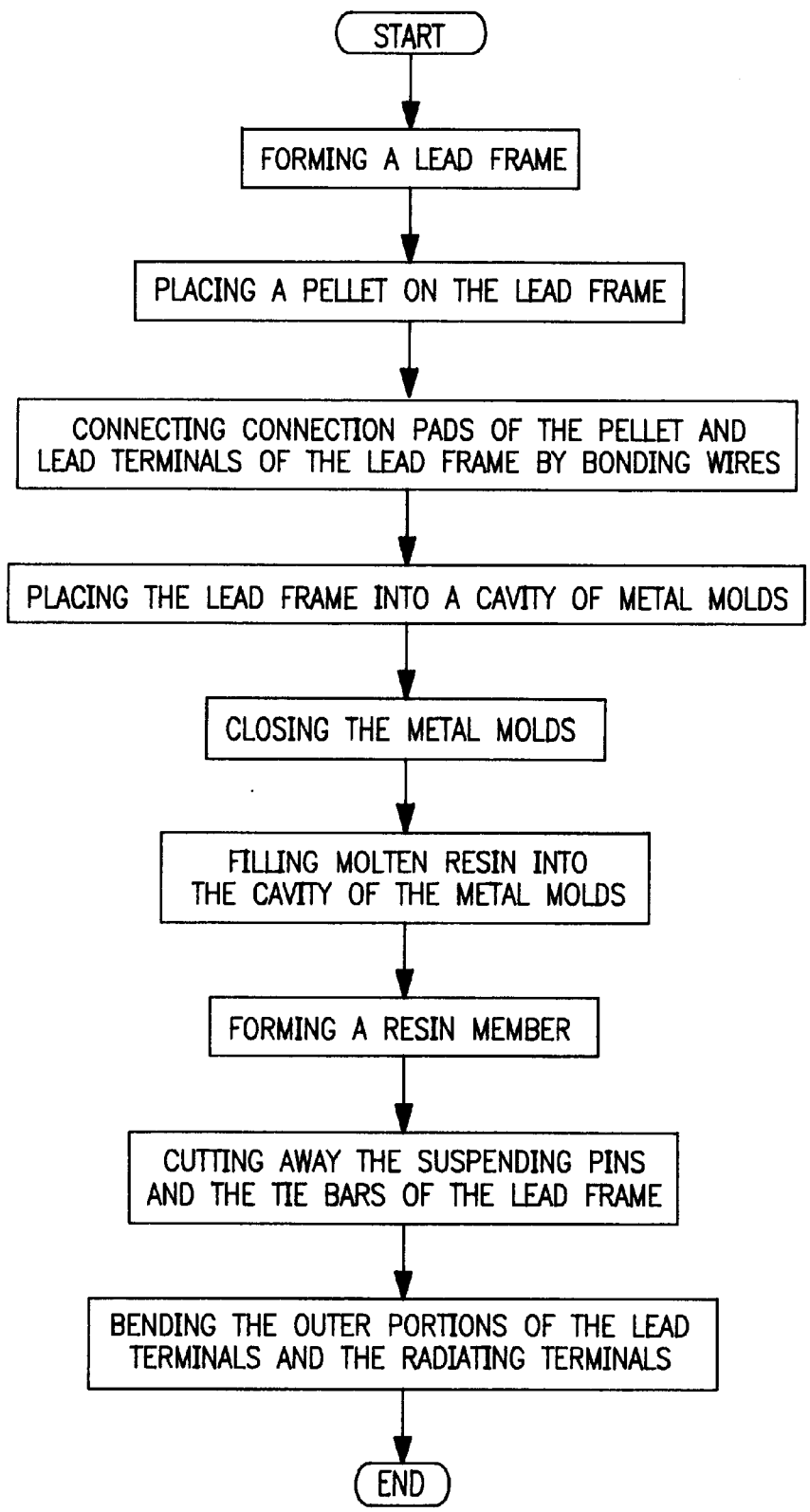
FIG. 8 is a flowchart showing a method of manufacturing a semiconductor device.

First, also in integrated circuit device 31 which is a semiconductor device of the present embodiment, a pair of radiating terminals 32 having a comparatively large width are provided projectingly on the opposite left and right sides of a radiating plate on which a pellet is mounted as shown in FIG. 7 similarly as in integrated circuit device 1 described hereinabove.

A plurality of lead terminals 33 having a comparatively small width are disposed at positions forwardly and rearwardly of and adjacent to radiating terminals 32, and outer portions 35 and 36 of terminals 32 and 33 provided in and projecting from resin member 34 are bent downwardly.

However, in integrated circuit device 31 of the present embodiment, different from integrated circuit device 1 described hereinabove, two holes 37 having a comparatively small width are formed at a bent portion of each of radiating terminals 32. Holes 37 of radiating terminals 32 have an inner width equal to that of the gaps between the plurality of lead terminals 33 and have an arrangement pitch equal to that of the gaps.

Also when integrated circuit device 31 of the present embodiment having such a construction as described above is mounted onto an upper surface of a circuit board, the plurality of lead terminals 33 of integrated circuit device 31 are connected to a plurality of signal lines of the circuit board by solder and the pair of radiating terminals 32 are connected to conductor patterns such as grounding lines or like lines of the circuit board.

Consequently, the pellet can input and output various information signals to and from the signal lines of the circuit board, and heat generated by the pellet can be radiated from radiating terminals 32.

Here, a method of manufacturing such integrated circuit device 31 as described above is described briefly below with reference to the drawings.

Figure 1:
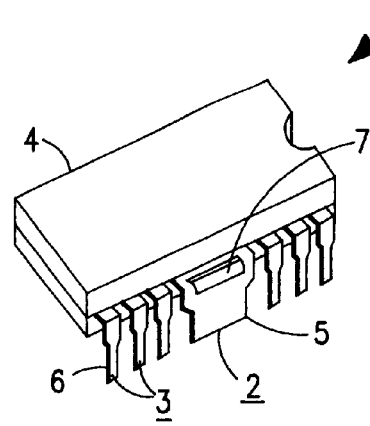
FIG. 1 is a perspective view showing an appearance of a semiconductor device of a conventional example.
Figure 2:
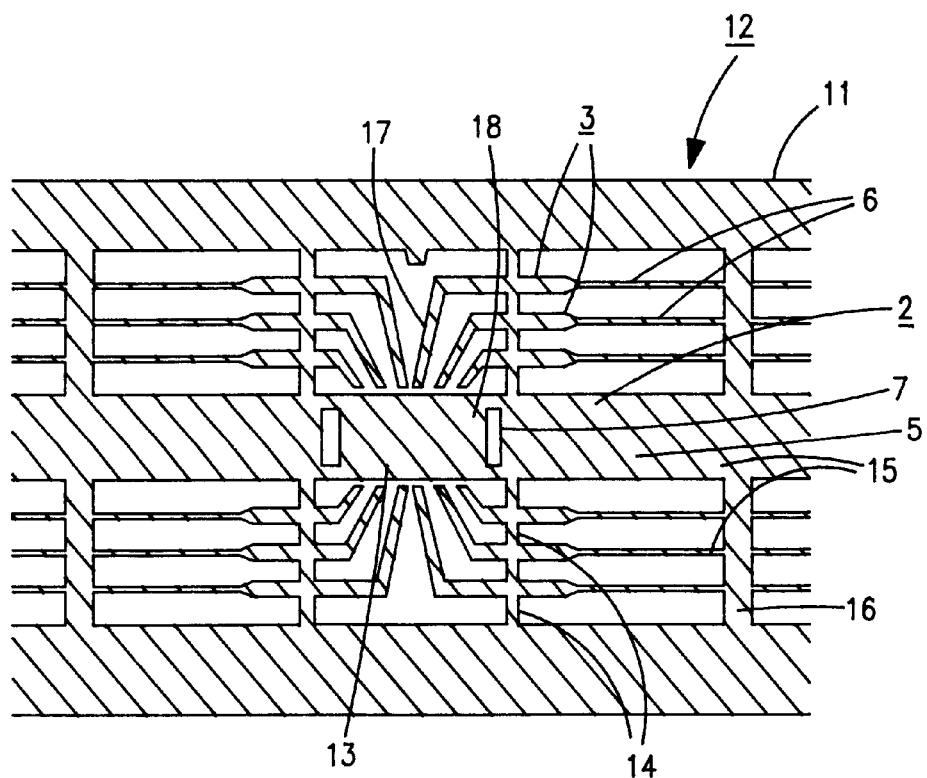
FIG. 2 is a plan view showing a lead frame of a conventional example.
Figure 3:
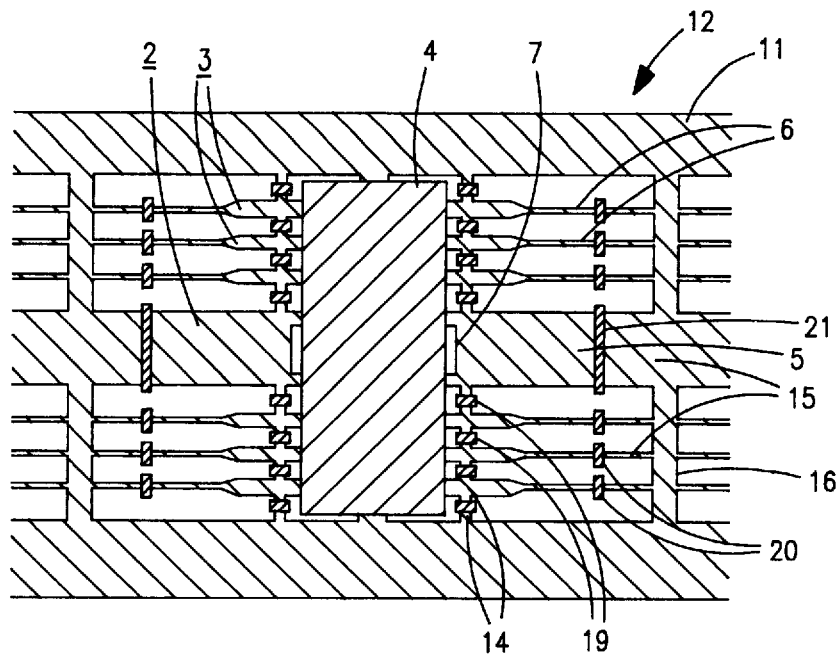
FIG. 3 is a plan view showing a condition wherein tie bars and suspending pins of a lead frame are cut away.
Figure 4:
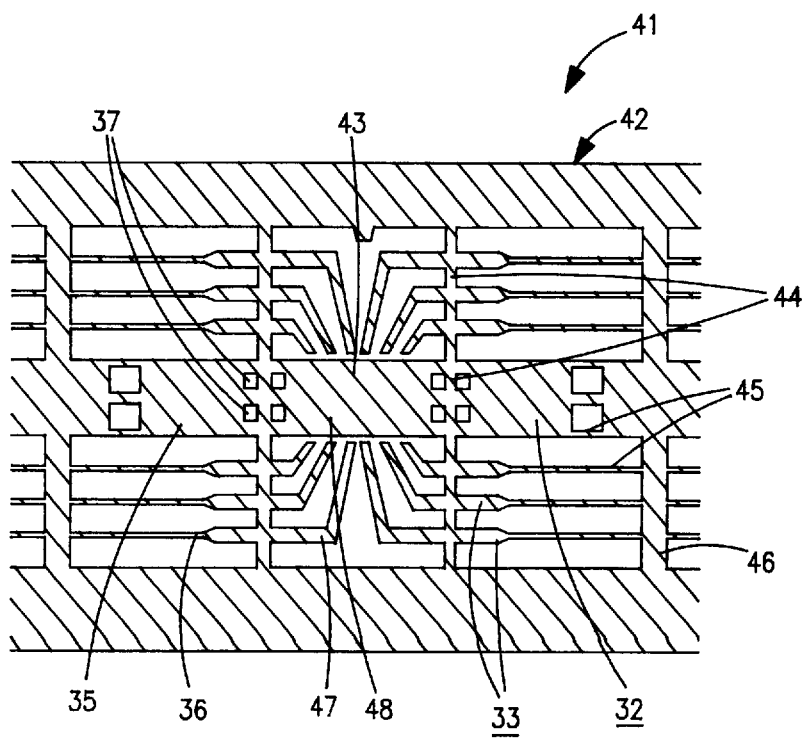
FIG. 4 is a plan view showing a lead frame of an embodiment of the present invention.

First, lead frame 41 is formed by etching a thin metal plate as seen in FIG. 4.

Also with this lead frame 41, a plurality of frame patterns 42 of integrated circuit devices 31 are provided in rows and columns, and radiating plate 43 is positioned at the center of each one frame pattern 42.

A pair of radiating terminals 32 having a comparatively large width are provided projectingly on the opposite left and right sides of radiating plate 43. A plurality of lead terminals 33 having a comparatively small width are arranged on the opposite front and rear sides of radiating terminals 32, which are upper and lower sides in FIG. 4.

Portions of terminals 32 and 33 to be bent are connected to each other by a plurality of tie bars 44. Outer end portions of terminals 32 and 33 are connected to outer frame portion 46 of frame pattern 42 by suspending pins 45.

Inner portions 47 of lead terminals 33 are formed such that they are directed radially toward the center of radiating plate 43. Inner portions 48 of radiating terminals 32 are formed integrally with radiating plate 43 .

Two holes 37 are formed at a portion of outer portion 35 of each of radiating terminals 32 at which radiating terminal 32 is to be bent. However, since the opposite front and rear sides of each of holes 37 which are the upper and lower sides in FIG. 4 are connected by one of tie bars 44, the two holes 37 at present point of time are formed as four holes.

Since holes 37 of radiating terminals 32 have an equal inner width and have an equal arrangement pitch as those of the gaps between the plurality of lead terminals 33 as described above, those tie bars 44 which interconnect the opposite sides of holes 37 have an equal overall length and an equal arrangement pitch as those of tie bars 44 which interconnect terminals 32 and 33.

Further, while the plurality of lead terminals 33 having a comparatively small width are individually connected to outer frame portion 46 of frame pattern 42 by a plurality of suspending pins 45 having a comparatively small width, each of radiating terminals 32 having a comparatively large width is connected to three suspending pins 45 having a comparatively small width. Those suspending pins 45 have an equal inner width and have an equal arrangement pitch.

A pellet comprising a semiconductor circuit is placed onto an upper surface of radiating plate 43 of lead frame 41 formed in such a manner as described above, and a plurality of connection pads of the pellet and the plurality of lead terminals 33 are individually connected to each other with bonding wires (not shown).

Lead frame 41 on which the pellet and the boarding wires are mounted integrally in this manner is placed into a cavity of a set of mutually removable metal molds such that it is held at outer portions 35 and 36 of terminals 32 and 33 by the between the metal molds, and in this condition, molten resin is filled into the cavity of the metal molds and is then left so as to be solidified to form resin member 34.

Figure 5:
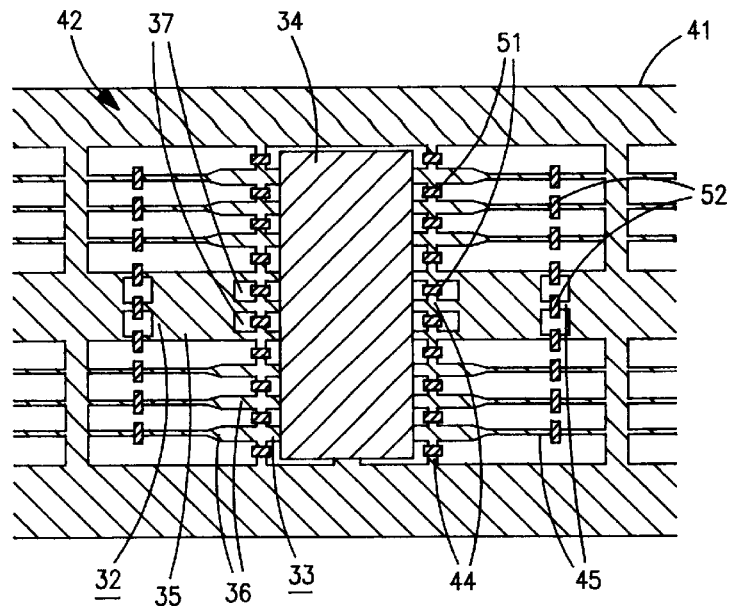
FIG. 5 is a plan view showing a condition wherein tie bars and suspending pins of the lead frame are cut away.
Figure 6:
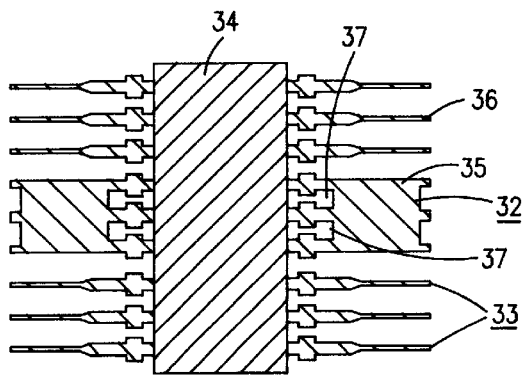
FIG. 6 is a plan view showing a condition after the tie bars and the suspending pins of the lead frame are cut away.

Then, as seen in FIGS. 5 and 6, tie bars 44 and suspending pins 45 of lead frame 41 which are exposed outwardly from resin member 34 are cut away and outer portions 35 and 36 of terminals 32 and 33 are separated from each other. Then, outer portions 35 and 36 are bent downwardly as seen in FIG. 7, thereby completing integrated circuit device 31.

With integrated circuit device 31 of the present embodiment, when outer portions 35 and 36 of terminals 32 and 33 are bent, although radiating terminals 32 have a generally large width, since they have holes 37 at portions to be bent thereof, they can be bent readily similarly to lead terminals 33 having a comparatively small width.

Besides, even if radiating terminals 32 and lead terminals 33 have different widths from each other, since tie bars 44 and suspending pins 45 have an equal width and are arranged in an equal pitch, punches 51 and 52 for cutting away them can be arranged in an equal pitch.

Consequently, an operation of setting punches 51 and 52 in position into a press machine (not shown) is simple, and also the universality of punches 51 and 52 thus set is high.

Further, lead terminals 33 having a comparatively small width and radiating terminals 32 having a comparatively large width are connected to outer frame portion 46 of lead frame 41 by suspending pins 45 having an equal comparatively small width. Accordingly, for punches 52 for cutting away suspending pins 45, a single kind of punches can be used, and integrated circuit device 31 can be manufactured in a high productivity.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device, comprising the steps of:

forming a lead frame including a single radiating plate having a pair of radiating terminals of a comparatively large width formed projectingly on the opposite sides thereof and a plurality of lead terminals of a comparatively small width arranged at positions adjacent to the radiating terminals, the radiating terminals and the plurality of lead terminals being connected to each other by means of the support elements, the radiating terminals each having at least one hole, whose width and pitch are equal in dimension to the width of gaps between the plurality of lead terminals, and whose opposite sides are connected to each other by one of the support elements;

placing a pellet comprising a semiconductor circuit and having a plurality of connection pads on an upper surface thereof onto an upper surface of the radiating plate of the lead frame;

connecting the plurality of connection pads of the pellet and the plurality of lead terminals of the lead frame individually to each other with bonding wires;

placing the lead frame on which the pellet and the bonding wires are mounted integrally into a cavity of a set of mutually removable metal molds;

closing said metal molds such that portions of the radiating terminals and portions of the lead terminals are held by said metal molds;

filling molten resin into said cavity of said metal molds;

solidifying the filled resin so as to form a resin member in which the pellet, the radiating plate, the bonding wires, the portions of the radiating terminals and the portions of the lead terminals are encapsulated;

cutting away the plurality of support elements positioned at the gaps between the lead terminals exposed to the outside from the resin member and the holes of the radiating terminals exposed to the outside from the resin member with an equal width and at an equal pitch to separate the radiating terminals and the lead terminals individually from each other; and bending the lead terminals exposed to the outside from the resin member downwardly and bending the radiating terminals at the positions of the holes exposed to the outside from the resin member downwardly.

2. A method of manufacturing a semiconductor device, comprising the steps of:

forming a lead frame including a single radiating plate having a pair of radiating terminals of a comparatively large width formed projectingly on the opposite sides thereof and a plurality of lead terminals of a comparatively small width arranged at positions adjacent to the radiating terminals, the radiating terminals and the plurality of lead terminals are connected to an outer frame portion of the lead frame by a plurality of support elements having an equal width and an equal pitch, the radiating terminals and the plurality of lead terminals being connected to each other by means of the support elements, the radiating terminals each having at least one hole two holes, whose width and pitch are equal in dimension to the width of gaps between the plurality of lead terminals, and whose opposite sides are connected to each other by one of the support elements;

placing a pellet comprising a semiconductor circuit and having a plurality of connection pads on an upper surface thereof onto an upper surface of the radiating plate of the lead frame;

connecting the plurality of connection pads of the pellet and the plurality of lead terminals of the lead frame individually to each other with bonding wires;

placing the lead frame on which the pellet and the bonding wires are mounted integrally into a cavity of a set of mutually removable metal molds;

closing said metal molds such that portions of the radiating terminals and portions of the lead terminals are held by said metal molds;

filling molten resin into said cavity of said metal molds;

solidifying the filled resin so as to form a resin member in which the pellet, the radiating plate, the bonding wires, the portions of the radiating terminals and the portions of the lead terminals are encapsulated;

cutting away the plurality of support elements positioned at the gaps between the lead terminals exposed to the outside from the resin member and the holes of the radiating terminals exposed to the outside from the resin member with an equal width and at an equal pitch to separate the radiating terminals and the lead terminals individually from each other, and cutting away the support elements which connected the outer frame portion of the lead frame to the radiating terminals and the plurality of lead terminals with an equal width and at an equal pitch; and bending the lead terminals exposed to the outside from the resin member downwardly and bending the radiating terminals at the positions of the holes exposed to the outside from the resin member downwardly.

3. A method of manufacturing a semiconductor device, comprising the steps of:

forming a lead frame including a single radiating plate having a pair of radiating terminals of a comparatively large width formed projectingly on the opposite sides thereof and a plurality of lead terminals of a comparatively small width arranged at positions adjacent to the radiating terminals, the radiating terminals and the plurality of lead terminals being connected to each other by means of the support elements, the radiating terminals each having at least two holes, whose width and pitch are equal to those of gaps between the plurality of lead terminals, and whose opposite sides are connected to each other by one of the support elements;

placing a pellet comprising a semiconductor circuit and having a plurality of connection pads on an upper surface thereof onto an upper surface of the radiating plate of the lead frame;

connecting the plurality of connection pads of the pellet and the plurality of lead terminals of the lead frame individually to each other with bonding wires;

placing the lead frame on which the pellet and the bonding wires are mounted integrally into a cavity of a set of mutually removable metal molds;

closing said metal molds such that portions of the radiating terminals and portions of the lead terminals are held by said metal molds;

filling molten resin into said cavity of said metal molds;

solidifying the filled resin so as to form a resin member in which the pellet, the radiating plate, the bonding wires, the portions of the radiating terminals and the portions of the lead terminals are encapsulated;

cutting away the plurality of support elements positioned at the gaps between the lead terminals exposed to the outside from the resin member and the holes of the radiating terminals exposed to the outside from the resin member with an equal width and at an equal pitch to separate the radiating terminals and the lead terminals individually from each other; and bending the lead terminals exposed to the outside from the resin member downwardly and bending the radiating terminals at the positions of the holes exposed to the outside from the resin member downwardly.

4. A method of manufacturing a semiconductor device, comprising the steps of:

forming a lead frame including a single radiating plate having a pair of radiating terminals of a comparatively large width formed projectingly on the opposite sides thereof and a plurality of lead terminals of a comparatively small width arranged at positions adjacent to the radiating terminals, the radiating terminals and the plurality of lead terminals are connected to an outer frame portion of the lead frame by a plurality of support elements having an equal width and an equal pitch, the radiating terminals and the plurality of lead terminals being connected to each other by means of the support elements, the radiating terminals each having at least two holes, whose width and pitch are equal to those of gaps between the plurality of lead terminals, and whose opposite sides are connected to each other by one of the support elements;

placing a pellet comprising a semiconductor circuit and having a plurality of connection pads on an upper surface thereof onto an upper surface of the radiating plate of the lead frame;

connecting the plurality of connection pads of the pellet and the plurality of lead terminals of the lead frame individually to each other with bonding wires;

placing the lead frame on which the pellet and the bonding wires are mounted integrally into a cavity of a set of mutually removable metal molds;

closing said metal molds such that portions of the radiating terminals and portions of the lead terminals are held by said metal molds;

filling molten resin into said cavity of said metal molds;

solidifying the filled resin so as to form a resin member in which the pellet, the radiating plate, the bonding wires, the portions of the radiating terminals and the portions of the lead terminals are encapsulated;

cutting away the plurality of support elements positioned at the gaps between the lead terminals exposed to the outside from the resin member and the holes of the radiating terminals exposed to the outside from the resin member with an equal width and at an equal pitch to separate the radiating terminals and the lead terminals individually from each other, and cutting away the support elements which connected the outer frame portion of the lead frame to the radiating terminals and the plurality of lead terminals with an equal width and at an equal pitch; and bending the lead terminals exposed to the outside from the resin member downwardly and bending the radiating terminals at the positions of the holes exposed to the outside from the resin member downwardly.

* * * * *